United States Patent [19]
> 
> Agrawal
>
> [11] Patent Number: 4,742,252
> [45] Date of Patent: May 3, 1988

[54] MULTIPLE ARRAY CUSTOMIZABLE LOGIC DEVICE

[75] Inventor: Om Agrawal, San Jose, Calif.

[73] Assignee: Advanced Micro Devices, Inc., Sunnyvale, Calif.

[21] Appl. No.: 717,640

[22] Filed: Mar. 29, 1985

[51] Int. Cl.$^4$ .................................... H03K 19/177
[52] U.S. Cl. .................. 307/465; 340/825.83; 364/716
[58] Field of Search ............. 307/465, 463, 466, 467, 307/468, 469; 364/716; 340/825.83, 825.84, 804

[56] References Cited

U.S. PATENT DOCUMENTS

| | | | |
|---|---|---|---|
| 4,034,356 | 7/1977 | Howley et al. | 307/465 |
| 4,207,556 | 6/1980 | Sugiyama et al. | 307/467 |
| 4,415,818 | 11/1983 | Ogawa et al. | 307/465 |
| 4,446,534 | 5/1984 | Smith | 307/202.1 |
| 4,609,986 | 9/1986 | Hartmann et al. | 364/716 |
| 4,617,479 | 10/1986 | Hartmann et al. | 307/465 |

Primary Examiner—Stanley D. Miller
Assistant Examiner—Timothy P. Callahan
Attorney, Agent, or Firm—Patrick T. King; Mark A. Haynes

[57] ABSTRACT

An integrated circuit having multiple programmable arrays in which a first programmable array receives a plurality of first inputs and generates a plurality of first outputs as programmed by the user. Also, a second programmable array receives a plurality of second inputs and generates a plurality of second outputs as programmed by the user. Also, buried state registers store signals as programmed by the user. An input multiplexer selects and supplies the first and second inputs from a variety of sources, including the first and second outputs, the buried state registers and I/O pins. An output multiplexer selects and supplies output signals to a set of output pins from a variety of sources, including the first and second outputs and the buried state registers.

37 Claims, 2 Drawing Sheets

MULTIPLE ARRAY CUSTOMIZABLE LOGIC DEVICE

FIELD OF THE INVENTION

The present invention relates to customizable integrated circuit logic devices, such as field programmable logic array devices.

BACKGROUND OF THE INVENTION

In the design of a logic circuit, a designer may utilize discrete components, such as resistors and transistors, standard small-scale integration (SSI) or medium-scale integration (MSI) devices, such as logic gates, registers, and counters, or large-scale integration (LSI) devices, such as customized gate arrays or microprocessors. In addition, instead of the foregoing types of parts for a logic circuit, the logic designer may utilize field programmable logic devices.

Obviously, the more discrete components that a designer utilizes in his circuit, the more flexibility in design that he may accomplish. However, by using SSI/MSI devices or dedicated LSI devices, the designer may accomplish many more functions in a smaller area on a given board and with much faster operating times than possible with a pure mixture of discrete components. However, for a given logic circuit, the chance that an off-the-shelf SSI/MSI device or dedicated large-scale integration device will meet a designer's need efficiently is small. While custom gate arrays may be manufactured to meet the designer's needs efficiently, these are prohibitively expensive. Thus the designer typically must utilize a combination of discrete components, SSI devices, MSI devices and dedicated LSI devices in a given logic circuit.

One way in which to further minimize the number of devices used in a given logic circuit is to utilize a field programmable logic device. The programmable logic device provides flexibility in design through its programmability, while minimizing the need to utilize a large number of devices and reducing the amount of board space used in creating the logic circuit.

Due to limitations in flexibility of existing programmable logic devices, very complicated circuits may require more than one programmable logic device, or require a programmable logic device associated with other SSI, MSI or LSI devices for complete implementation. The larger the number of discrete integrated circuit devices utilized in a given logic circuit, the slower the device and the larger the amount of board space taken up by the circuit. Furthermore, a larger number of devices is more expensive to implement. A more flexible programmable device would serve to reduce the expense and board space required for a given logic circuit.

One way in which to increase the flexibility of a programmable logic device is to increase the size of the programmable logic array on the device. However, by increasing the size of the logic array, the speed of operation of the device suffers. Thus a very large logic array may be unacceptable in some applications.

Accordingly, there is a need for a customizable integrated circuit having increased flexibility and speed for use by a logic designer involved in creating complicated logic circuits.

SUMMARY OF THE INVENTION

The present invention provides an integrated circuit having customizable logic, comprising a first programmable array means for receiving a plurality of first input terms and generating a plurality of first output terms as programmed by the user, and a second programmable array means for receiving a plurality of second input terms and generating a plurality of second output terms as programmed by the user. Also included is a means for selectively interconnecting the plurality of first input terms, the plurality of first output terms, the plurality of second input terms and the plurality of second output terms, whereby the architecture of the integrated circuit having customizable logic can be adapted to suit the needs of a particular logic circuit. In particular, the first programmable array means and the second programmable array means may be configured in series, in parallel, or in a combination of series and parallel as suits the needs of the user.

In another apsect, the present invention includes a plurality of buried state registers, responsive to at least a subset of the plurality of first output terms and plurality of second output terms, for providing stored signals that are available for use as input terms and/or output terms.

The means for selectively interconnecting the input and output terms includes in a preferred embodiment an input multiplexing means, responsive to an input select signal, for supplying as the plurality of first input terms or as the plurality of second input terms, a subset of signals selected from a plurality of signals, the plurality of signals selectable including a set of signals selected from the plurality of first input terms, the plurality of second input terms, the plurality of first output terms, and the plurality of second output terms. Also, the means for selectively interconnecting includes an output multiplexing means, responsive to an output select signal, for supplying as output signals a subset of signals selected from a plurality of signals, the plurality of signals selectable as output signals including a set of signals selected from the plurality of first output terms and the plurality of second output terms.

It can be seen that the present invention provides an integrated circuit having customizable logic that is adaptable to provide a wide range of logic functions due to the increased flexibility in programming resulting from multiple programming arrays on a single chip. Thus, a logic designer utilizing an integrated circuit according to the present invention is able to implement a given logic circuit using fewer components, providing higher speed operation and reducing board space necessary for the circuit.

DETAILED DESCRIPTION

Figure 1:
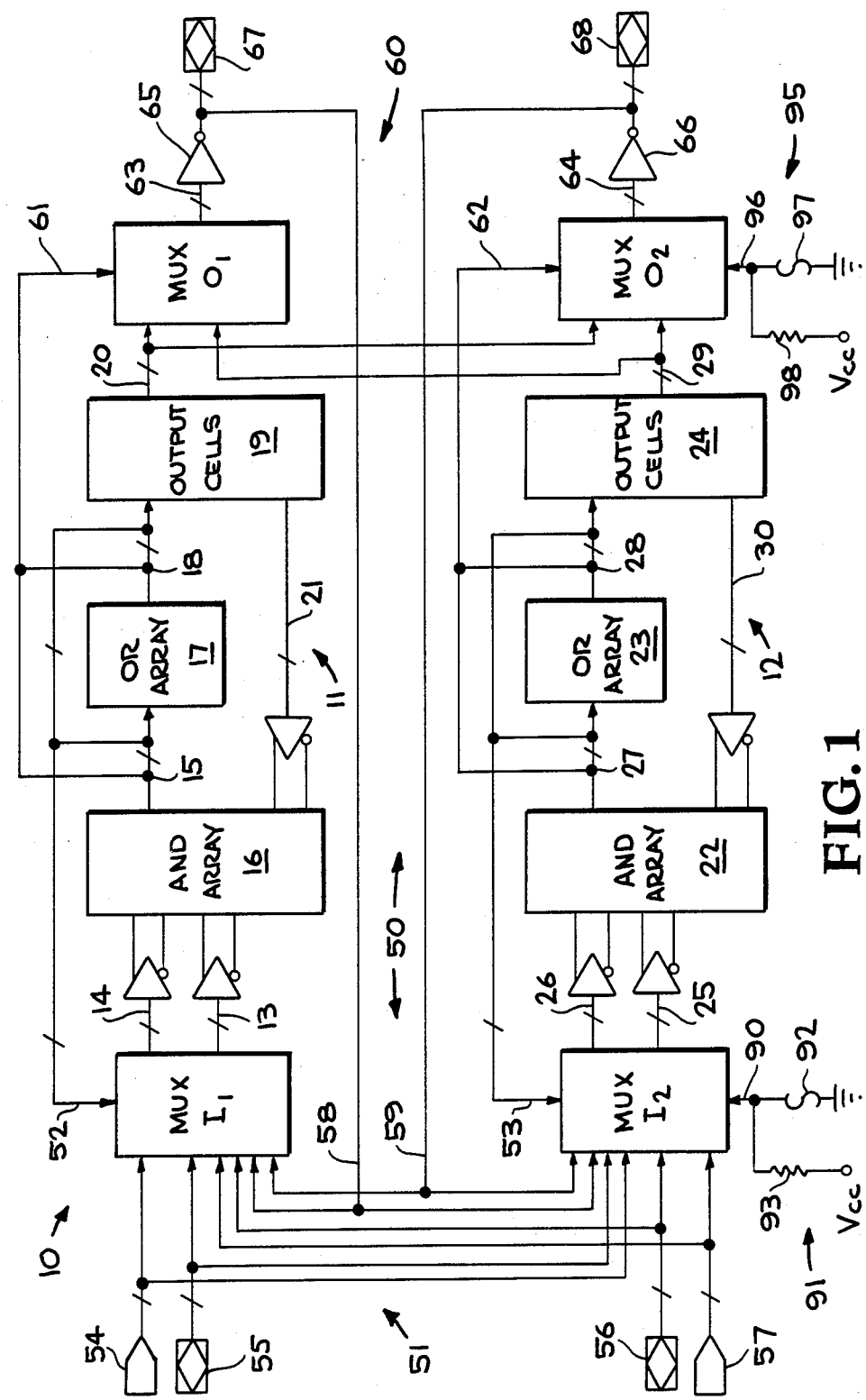
FIG. 1 is a schematic diagram of an integrated circuit according to one preferred embodiment of the present invention.
Figure 2:
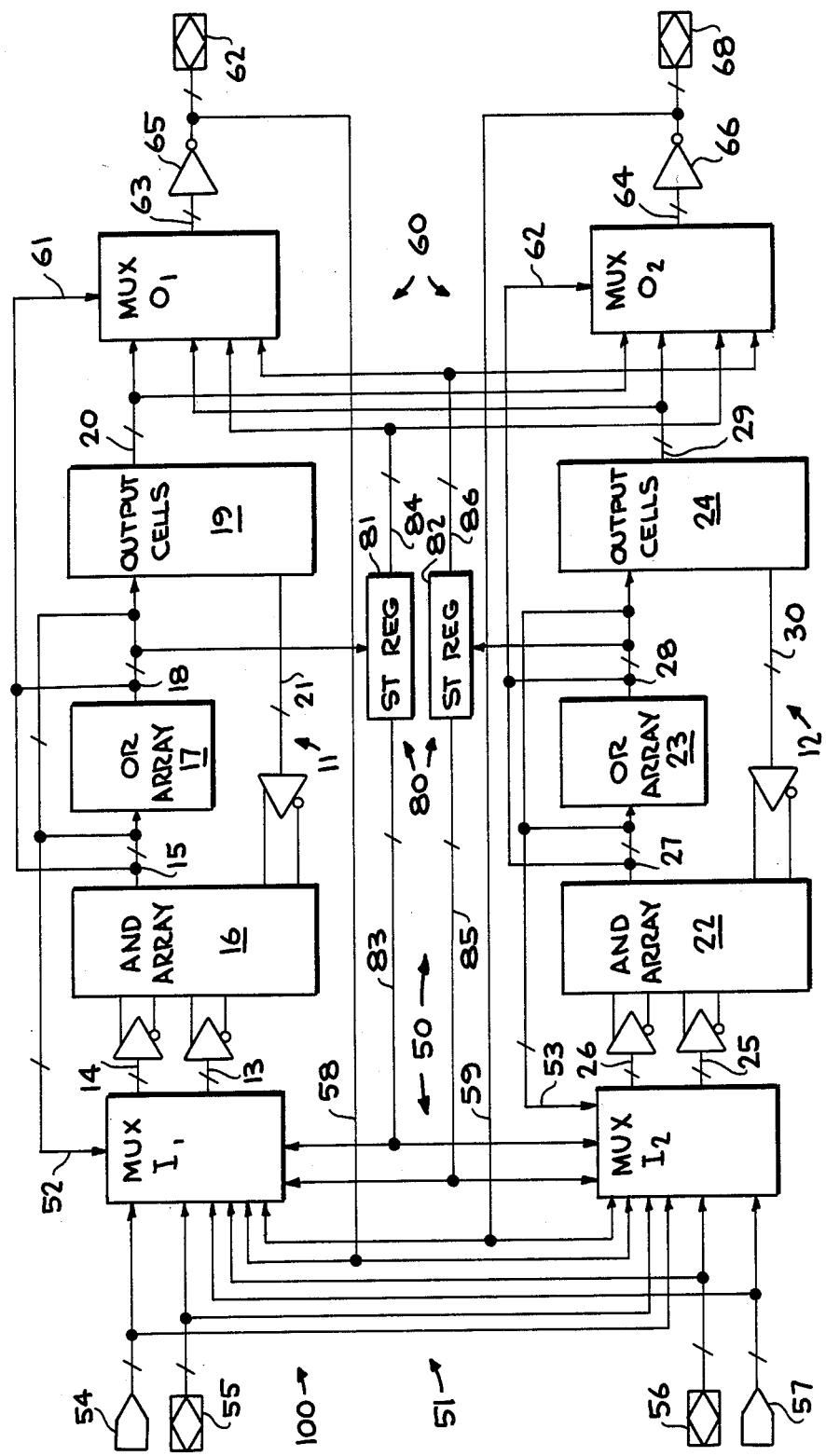
FIG. 2 is a schematic diagram of an integrated circuit according to a second preferred embodiment of the present invention.

With reference to FIGS. 1 and 2, the architecture of an integrated circuit customizable logic device according to the present invention is described.

FIG. 1 shows a diagram of the architecture of a multiple array programmable logic device 10 according to the present invention. The device 10 includes a first programmable array means 11 for receiving a plurality of first input terms and generating a plurality of first output terms and a second programmable array means 12 for receiving a plurality of second input terms and generating a plurality of second output terms.

The first programmable array means 11 includes an AND array 16 that receives the plurality of first input terms across line 13 and at least one clock term across line 14 and generates a plurality of first product terms across line 15 in response to the first input terms and the clock terms as programmed by the user. The AND array 16 is preferably a field programmable AND array such as those described in the publication entitled *Programmable Array Logic Handbook*, published by Advanced Micro Devices, Inc. (1984), and available through Advanced Micro Devices, Inc., Sunnyvale, Calif. Of course, other embodiments of the AND array including a fixed AND array may be utilized as desired.

In the first programmable array means 11, the first product terms on line 15 are supplied to an OR array 17. The OR array 17 generates a plurality of first sum-of-products terms on line 18 in response to the first product terms on line 15. The OR array may be a fixed OR array or a programmable OR array as described in the above-mentioned

PROGRAMMABLE ARRAY LOGIC HANDBOOK

The first sum-of-products terms on line 18 are supplied to a plurality of output cells 19 which generate output logic terms on line 20 for the first programmable array means 11. Further, the output cells 19 may generate feedback terms on line 21 which are fed back to the AND array 16 and utilized in the generation of the first product terms 15 as programmed by the user.

The second programmable array means 12 consists of components similar to the first programmable array means 11. Thus the second programmable array means 12 includes AND array 22, which may be either fixed or programmable, and OR array 23, either fixed or programmable, and a plurality of output cells 24. The second programmable array means 12 receives as input a plurality of second input terms on line 25 and at least one clock input term on line 26. The output of the AND array 22 of the second programmable array means 12 includes a plurality of second product terms 27. The output of the OR array 23 includes a plurality of second sum-of-products terms on line 28. The plurality of second sum-of-products terms is passed through the output cells 24 and supplied as a plurality of second output terms on line 29. The output cells 24 may generate feedback terms across line 30 for supply back to the AND array 22 for use in generation of the second product terms on line 27 as programmed by the user.

It should be appreciated that the first programmable array means 11 and the second programmable array means 12 may preferably be individually configured to include a programmable AND array with a fixed OR array, a fixed AND array with a programmable OR array, a programmable AND array with a programmable OR array or other programmable array configuration generating sum-of-products terms to facilitate conventional sum-of-products logic design.

The output cells 19 and the output cells 24 for the first and second programmable arrays means 11, 12, respectively, consist preferably of output cells such as those disclosed in my prior U.S. patent application entitled Dynamically Controllable Output Logic Circuit, Ser. No. 656,109, filed Sept. 28, 1984, or any of the output configurations disclosed in the *Programmable Array Logic Handbook* referred to above.

The device 10 includes a means 50 for selectively interconnecting at least subsets of the plurality of first input terms from lines 13, 14, the plurality of first output terms from lines 20, the plurality of second input terms from lines 25, 26 and the plurality of second output terms from lines 29. The means 50 for selectively interconnecting allows the device 10 to be configured so that the first programmable array means 11 is connected in series with the second programmable array means 12, or the first programmable array means 11 is connected in parallel with the second programmable array means 12 or any combination of interconnections. A particular embodiment may interconnect subsets of the input and output terms, so that all or any portion of the plurality of first input terms, plurality of first output terms, plurality of second input terms, and plurality of second output terms may be routed as desired to provide the flexibility desired by a manufacturer.

In the embodiment shown in FIG. 1, the means 50 for selectively interconnecting includes an input multiplexing means 51 (MUX $I_1$, MUX $I_2$), responsive to an input select signal on lines 52, 53, for selecting and supplying a set of signals as the plurality of first input terms or as the plurality of second input terms, from a plurality of signals. As shown in the figure, the input multiplexing means 51 selects from the plurality of signals including a first set of clock signals supplied from input pins 54, a first set of input signals externally supplied to the chip from a first set of input/outpt pins 55, a second set of input signals supplied from a second set of input/output pins 56, a second set of clock signals supplied from input pins 57, and a set of output signals, generated in response to at least a subset of the plurality of first output terms from line 20 and the plurality of second output terms from lines 29, supplied across lines 58 and 59 respectively.

The input select signal on lines 52 and 53 in the preferred embodiment is supplied as at least a subset of the first and second product terms from lines 15 and 27, respectively, or at least a subset of the first and second sum-of-products terms from lines 18 and 28, respectivly, or any combination of the product terms and sum-of-products terms generated by the first programmable array means 11 and the second programmable array means 12.

Also, as shown in FIG. 1, the input select signal may be field programmable. Thus, FIG. 1 shows an input select signal supplied on line 90 to input multiplexer MUX $I_2$ from a fuse programmable signal generator 91. The fuse programmable signal generator 91 includes a fuse 92 connected from line 90 to ground and a resistor 93 connected from line 90 to a power supply voltage $V_{CC}$. Fuse 92 is a field programmable fuse such as those described in the *Programmable Array Logic Handbook*, referred to above.

The input multiplexing means 51 in the preferred embodiment consists of a first input multiplexer MUX $I_1$, responsive to the input select signal on lines 52, for selecting a set of signals for supply as input signals on lines 13, 14, and a second input multiplexer MUX $I_2$, responsive to the input select signal on lines 53 or 90, for selecting a set of signals for supply as input term signals on lines 25, 26. In the embodiment shown, both the first input multiplexer MUX $I_1$ and the second input multiplexer MUX $I_2$ are supplied the same sets of signals from pins 54, 55, 56 and 57 for selection and supplying as input terms. The first input multiplexer MUX $I_1$ supplies the plurality of first input terms on lines 13, 14. The second input multiplexer MUX $I_2$ supplies the plurality of second input terms on lines 25, 26.

The means 50 for selectively interconnecting also includes an output multiplexing means 60, responsive to an output select signal on lines 61, 62, for selecting and supplying as output signals on lines 63 and 64, respectively, a set of signals selected from at least a subset of the plurality of first output terms from lines 20 and the plurality of second output terms from lines 29. The output signals on lines 63, 64 are supplied from the integrated circuit device 10 externally through output drivers 65, 66 to sets of I/O pins 67, 68.

The output select signals on lines 61 and 62 can be generated from the first set of product terms on lines 15, second set of product terms on lines 27, first set of sum-of-products terms on lines 18, second set of sum-of-products terms on lines 28 or any combination of product terms and sum-of-product terms as suits the user.

Also, as shown in FIG. 1, the output select signal may be fuse programmable. Thus, FIG. 1 shows a fuse programmable signal generator 95 supplying an output select signal on line 96. The fuse programmable signal generator 95 includes a fuse 97 connected from line 96 to ground and a resistor 98 connected from line 96 to power supply voltage $V_{CC}$. Fuse 96 is programmable as described in the above mentioned *Programmable Array Logic Handbook*.

The output multiplexing means 60 in the embodiment shown consists of a first output multiplexer MUX $O_1$ and a second output multiplexer MUX $O_2$. The first output multiplexer MUX $O_1$, responsive to the output select signal on lines 61, selects a set of signals for supply as output signals on lines 63, while the second output multiplexer MUX $O_2$, responsive to the output select signal on lines 62 or 96, selects a set of signals for supply as output signals on lines 64.

The diagram of FIG. 1 shows four sets of I/O pins, designated 55, 56, 67 and 68. Each of these sets of I/O pins may include any number of I/O pins corresponding to the number of output signals generated on lines 63 and 64 and the number of input signals supplied from the I/O pins 55, 56 as desired. It should be noted, that the four sets of I/O pins, 55, 56, 67 and 68, are not necessarily exclusive. For instance, the set of I/O pins 67 receiving output signals across line 63 from the output multiplexer MUX $O_1$ is also connected to provide input signals to the input multiplexers MUX $I_1$ and MUX $I_2$ across line 58. Thus, an architecture for a device 10 according to the present invention may be laid out in which all or any subset of the I/O pins are configured to receive output signals and/or supply input signals.

Furthermore, in the preferred embodiment, the set of clock input pins 54 and the set of clock input pins 57 may include any number of clock inputs.

In one preferred embodiment, there are two clock input pins in the first set of clock input pins 54, two clock input pins in the second set of clock input pins 57, and forty I/O pins configured to provide sets of I/O pins such as those designated 55, 56, 67 and 68.

Thus it can be seen that the device 10 provides a total interconnectivity of the available signals and logic terms as input terms or as output terms. This allows the user the ability to configure the device 10 such that the first programmable array means 11 operates in series with the second programmable array means 12, such as by providing the output signals from line 63 as one of the sets of signals across line 58 that is selectable by the second input multiplexer MUX $I_2$ as at least a subset of the plurality of second input terms on line 25, 26. Of course, the second programmable array means 12 may be connected in the same manner with respect to the first programmable array means 11. Alternatively, the first programmable array means 11 and the second programmable array means 12 may be connected in parallel such that each receives the same input signals as input terms on lines 13, 14 and 25, 26, respectively, such as the input signals supplied by the set of input pins 56, and each generates a plurality of output terms across lines 20 and 29, respectively, that are selectively supplied to a set of I/O pins 67, 68.

A wide variety of other interconnection architectures can be made utilizing the means 50 for selectively interconnecting according to the present invention. For instance, a subset of the output signals from lines 63 might be supplied as a part of the set of input signals selectable by the second input multiplexer MUX $I_2$ across line 58. Thus a portion of the logic terms generated by the second programmable logic array means 12 would be generated in response to a series connection of the first programmable logic array means 11 and the second programmable logic array means 12 while others of the logic terms generated by a second programmable array means 12 would be generated in parallel with or independently from logic terms generated by the first programmable array means 11. In this embodiment, for instance the I/O pins 67 receiving output terms from the first programmable array means 11 might include a fewer number of pins than I/O pins 68 supplying output signals from the second programmable array means 12. As can be seen, flexibility of the present invention is extremely valuable.

FIG. 2 shows an alternate preferred embodiment of a customizable logic device 100 according to the present invention. The apparatus 100 of FIG. 2 includes components identical to the device 10 shown in FIG. 1 and those components are numbered with like reference numerals for consistency. Furthermore, the description of the components and their interconnection given with reference to the device 10 of FIG. 1 applies equally to the like numbered components of the device 100 of FIG. 2.

The device 100 of FIG. 2 includes in addition to the components of the device 10 shown in FIG. 1, a set of buried state registers 80, responsive to a set of logic terms, such as at least a subset of a plurality of first sum-of-product terms from line 18 and plurality of second sum-of-product terms from line 28, for storing stored signals internal to the device 100. The logic terms may include product terms, output terms or other signals from the programmable arrays.

As shown in FIG. 2, the set 80 of buried state registers includes a first set 81 and a second set 82. The state registers may consist of a plurality of D-type flip-flops, a plurality of JK-type flip-flops, or any other type of registers. Furthermore, there may be a combination of various types of registers within the set 80 of buried state registers to provide additional flexibility.

The first set 81 of buried state registers supplies at least a subset of the stored signals across line 83 as a set of signals that is selectable by the input multiplexing means 51. Likewise, the first set 81 of buried state registers supplies at least a subset of its stored signals across line 84 as a set of signals that is selectable by the output multiplexing means 60.

Likewise, the second set 82 of buried state registers supplies at least a subset of its stored signals across line 85 as a set of signals that is selectable by the input multiplexing means 51. Also, at least a subset of the stored signals from the second set 82 of buried state registers is suppled across line 86 as a set of signals that is selectable by the output multiplexing means 60.

By configuring the subset of sum-of-products terms from lines 18 and 28, or other logic terms, as desired and by controlling the input multiplexing means 51 and the output multiplexing means 60 as desired, the set 80 of buried state registers can be utilized by a designer to provide added flexibility and power to a given logic circuit without the necessity of tying up additional input/output pins.

The present invention provides a novel, customizable logic device formed on a single integrated circuit which avoids the utilization of excessively large programmable arrays which may cause the device to be slow, but provides increased flexibility over prior art customizable logic devices. Furthermore, the utilization of input-/output pins, such as those sets designated 55, 56, 67, and 68, can be optimized by appropriate control of the input multiplexing means 51 and the output multiplexing means 60, so that the physical location of a given input/output pin is not constrained by a hardware design of the customizable logic device.

In addition to the increased flexibility in design provided by the customizable logic device 10 of the present invention, the device 10 includes additional power created by the buried state registers 80 in one preferred embodiment. These buried state registers 80 allow a designer to store signals without tying up an output term from either of the programmable logic arrays.

It should be appreciated that though the description involves customizable logic device 10 utilizing two programmable array means 11, 12, the device may be expanded to include any number of programmable array means, by increasing the selectivity of the input multiplexing means 51 and the output multiplexing means 60.

The foregoing description of a preferred embodiment of the invention has been presented for the purposes of illustration and description. It is not intended to be exhaustive or to limit the invention to the precise form disclosed, and obviously many modifications and variations are possible in light of the above teaching. The embodiments utilizing AND arrays followed by OR arrays were chosen and described in order to best explain the principles of the invention and its practical application for the design of conventional sum-of-products logic circuits and to thereby enable others skilled in the art to best utilize the invention in various embodiments and with various modifications as are suited to the particular use contemplated. It is intended that the scope of the invention be defined by the claims appended hereto.

I claim:

1. An integrated circuit having a plurality of input pins receiving input signals and a plurality of output pins, comprising:
   first programmable array means, coupled to the plurality of input pins, for receiving a plurality of first input terms and generating a plurality of first output terms including a first AND-array receiving the first input terms and generating first product terms, and a first OR-array receiving the first product terms and generating first sum-of-product terms for supply as the first output terms;
   second programmable array means, coupled to the plurality of output pins and to the first programmable array means, for receiving the plurality of first output terms and generating a plurality of second output terms for supply to the plurality of output pins including a second AND-array receiving the first output terms and generating second product terms and a second OR-array receiving the second product terms and generating second sum-of-product terms for supply as the second output terms.

2. An integrated circuit having a plurality of pins adapted for communicating signals to and from the circuit, comprising:
   first programmable array means, connected to receive a plurality of first input terms, for generating a plurality of first output terms;
   second programmable array means, connected to receive a plurality of second input terms, for generating a plurality of second output terms;
   input multiplexing means, responsive to an input select signal, for selecting and supplying a first subset of a set of input signals as the plurality of first input terms for the first programmable array means and a second subset of the set of input signals as the plurality of second input terms for the second programmable array means;
   means for supplying the input select signal; and
   input connecting means for connecting the set of input signals to the input multiplexing means, the set of input signals comprising a plurality of signals externally supplied to a first subset of the plurality of pins.

3. The integrated circuit of claim 2, wherein:
   said first programmable array means includes at least one programmable array generating first logic terms;
   said second programmable array means includes at least one programmable array generating second logic terms; and
   said means for supplying said input select signal includes means connecting at least one logic term of said first and second logic terms as said input select signal.

4. The integrated circuit of claim 2, wherein said means for supplying said input select signal comprises:
   a fuse programmable signal generator.

5. The integrated circuit of claim 2, wherein:
   said first programmable array means includes an AND array connected to receive the first input terms generating first product terms and an OR array connected to receive the first product terms generating first sum-of-products terms for supply as the first output terms;
   said second programmable array means includes an AND array connected to receive the second input terms generating second product terms and an OR array connected to receive the second product terms generating second sum-of-product terms; wherein the first and second product terms and first and second sum-of-products terms are logic signals, and said means for supplying said input select signal supplies at least one of the logic signals as said input select signal.

6. The integrated circuit of claim 2, wherein the set of input signals further comprises a subset of the plurality of first output terms.

7. The integrated circuit of claim 6, wherein the set of input signals further comprises a subset of the plurality of second output terms.

8. The integrated circuit of claim 2, further including:
a buried state means, connected to receive one output term of the plurality of first output terms, for storing the one output term and supplying a stored output term; and wherein the set of input signals further comprises the stored output term.

9. The integrated circuit of claim 2, wherein the first output terms and the second output terms are logic signals, and further including:
buried state means, connected to receive a preselected plurality of logic signals, for storing the preselected plurality of logic signals and supplying a plurality of stored logic terms; and wherein the set of input signals further comprises the plurality of stored logic terms.

10. The integrated circuit of claim 2, further including:
output multiplexing means, responsive to an output select signal, for selecting and supplying a subset of a set of output signals to a second subset of the plurality of pins;
means for supplying the output select signal; and
output connecting means for connecting the set of output signals to the output multiplexing means, the set of output signals comprising (1) a subset of the plurality of first output terms and (2) a subset of the plurality of second output terms.

11. The integrated circuit of claim 10, wherein:
said first programmable array means includes at least one programmable array generating first logic terms;
said second programmable array means includes at least one programmable array generating second logic terms; and
said means for supplying said output select signal includes means connecting at least one logic term of said first and second logic terms as said output select signal.

12. The integrated circuit of claim 10, wherein said means for supplying said output select signal comprises:
a fuse programmable signal generator.

13. The integrated circuit of claim 10, wherein:
said first programmable array means includes an AND array connected to receive the first input terms generating first product terms and an OR array connected to receive the first product terms generating first sum-of-products terms for supply as the first output terms;
said second programmable array means includes an AND array connected to receive the second input terms generating second product terms and an OR array connected to receive the second product terms generating second sum-of-product terms; wherein the first and second product terms and first and second sum-of-products terms are logic signals, and
said means for supplying said output select signal supplies at least one of the logic signals as said output select signal.

14. The integrated circuit of claim 10, further including:
a buried state means, connected to receive one output term of the plurality of first output terms, for storing the one output term and supplying a stored output term; and wherein the set of output signals further comprises the stored output term.

15. The integrated circuit of claim 10, wherein the first output terms and the second output terms are logic signals, and further including:
buried state means, connected to receive a preselected plurality of the logic signals, for storing the preselected plurality of logic signals and supplying a plurality of stored logic terms; and wherein the set of output signals further comprises the plurality of stored logic terms.

16. The integrated circuit of claim 15 wherein said buried state means includes:
a first set of registers of a first type for storing logic terms and a second set of registers of a second type for storing logic terms.

17. The integrated circuit of claim 10, wherein the first output terms and the second output terms are logic signals, and further including:
buried state means, connected to receive a preselected plurality of the logic signals, for storing the preselected plurality of logic signals and supplying a plurality of stored logic terms; and wherein the set of input signals further comprises a first subset of the plurality of stored logic terms and the set of output signals further comprises a second subset of the plurality of stored logic terms.

18. An integrated circuit having a plurality of pins adapted for communicating signals to and from the circuit, comprising:
first programmable array means, connected to receive a plurality of first input terms, for generating a plurality of first output terms;
second programmable array means, connected to receive a plurality of second input terms, for generating a plurality of second output terms;
first input multiplexing means, responsive to a first input select signal, for selecting and supplying a subset of a first set of input signals as the plurality of first input terms for the first programmable array means;
second input multiplexing means, responsive to a second input select signal, for selecting and supplying a subset of a second set of input signals as the plurality of second input terms for the second programmable array means;
means for supplying the first and second input select signals;
input connecting means for connecting the first set of input signals to the first input multiplexing means and the second set of input signals to the second input multiplexing means, the first set of input signals comprising signals externally supplied to a first subset of the plurality of pins and the second set of input signals comprising signals externally supplied to a second subset of the plurality of pins;
first output multiplexing means, responsive to a first output select signal, for selecting and supplying a subset of a first set of output signals to a third subset of the plurality of pins;
second output multiplexing means, responsive to a second output select signal, for selecting and supplying a subset of a second set of output signals to a fourth subset of the plurality of pins;

means for supplying the first and second output select signals; and output connecting means for connecting the first set of output signals to the first output multiplexing means and the second set of output signals to the second output multiplexing means, the first set of output signals comprising (1) a first subset of the plurality of first output terms and (2) a first subset of the plurality of second output terms and the second set of output signals comprising (1) a second subset of the plurality of second output terms.

19. The integrated circuit of claim 18, wherein:

at least a subset of said signals externally supplied to the first subset of the plurality of pins include clock signals, and at least a subset of said plurality of first input terms and said plurality of second input terms include the clock signals.

20. The integrated circuit of claim 18 wherein:

said first programmable array means includes a fuse programmable logic array generating sum-of-products terms; and said second programmable array means includes a fuse programmable logic array generating sum-of-products terms.

21. The integrated circuit of claim 18, wherein:

said first programmable array means includes an AND array connected to receive the first input terms generating first product terms and an OR array connected to receive the first product terms generating first sum-of-products terms for supply as the first output terms;

said second programmable array means includes an AND array connected to receive the second input terms generating second product terms and an OR array connected to receive the second product terms generating second sum-of-product terms; wherein the first and second product terms and first and second sum-of-products terms are logic signals, and said means for supplying said input select signal supplies at least one of the logic signals as said input select signal.

22. The integrated circuit of claim 18 wherein means for supplying said input select signal comprises:

a fuse programmable signal generator.

23. The integrated circuit of claim 18 wherein said means for supplying said output select signal comprises:

a fuse programmable signal generator.

24. The integrated circuit of claim 18, wherein the second set of output signals further comprises a second subset of the plurality of first output terms.

25. The integrated circuit of claim 18, wherein the second set of input signals further comprises a second subset of the plurality of first output terms.

26. The integrated circuit of claim 18, wherein the first set of input signals further comprises a second subset of the plurality of first output terms.

27. The integrated circuit of claim 18, wherein the second set of input signals further comprises a third subset of the plurality of second output terms.

28. The integrated circuit of claim 18, wherein the first set of input signals further comprises a third subset of the plurality of second output terms.

29. The integrated circuit of claim 18, wherein the first set of input signals further comprises a third subset of the plurality of second output terms and a second subset of the plurality of first output terms.

30. The integrated circuit of claim 18, wherein the second set of input signals further comprises a third subset of the plurality of second output terms and a second subset of the plurality of first output terms.

31. The integrated circuit of claim 18, wherein the first output terms and the second output terms are logic signals, and further including:

buried state means, connected to receive a preselected plurality of the logic signals, for storing the preselected plurality of logic signals and supplying a set of stored logic terms; and wherein the first set of input signals further comprises a subset of the set of stored logic terms.

32. The integrated circuit of claim 31 wherein said buried state means includes:

a first set of registers of a first type for storing logic terms and a second set of registers of a second type for storing logic terms.

33. The integrated circuit of claim 18, wherein the first output terms and the second output terms are logic signals, and further including:

buried state means, connected to receive a preselected plurality of the logic signals, for storing the preselected plurality of logic signals and supplying a set of stored logic terms; and wherein:

the second set of input signals further comprises a subset of the set of stored logic terms.

34. The integrated circuit of claim 18, wherein the first output terms and the second output terms are logic signals, and further including:

buried state means, connected to receive a preselected plurality of the logic signals, for storing the preselected plurality of logic signals and supplying a set of stored logic terms; and wherein:

the first set of input signals further comprises a first subset of the set of stored logic terms and the second set of input signals further comprises a second subset of the set of stored logic terms.

35. The integrated circuit of claim 18, wherein the first output terms and the second output terms are logic signals, and further including:

buried state means, connected to receive a preselected plurality of the logic signals, for storing the preselected plurality of logic signals and supplying a set of stored logic terms; and wherein:

the first set of output signals further comprises a subset of the set of stored logic terms.

36. The integrated circuit of claim 18, wherein the first output terms and the second output terms are logic signals, and further including:

buried state means, connected to receive a preselected plurality of the logic signals, for storing the preselected plurality of logic signals and supplying a set of stored logic terms; and wherein:

the second set of output signals further comprises a subset of the set of stored logic terms.

37. The integrated circuit of claim 18, wherein the first output terms and the second output terms are logic signals, and furhter including:

buried state means, connected to receive a preselected plurality of the logic signals, for storing the preselected plurality of logic signals and supplying a set of stored logic terms; and wherein the first set of output signals further comprises a first subset of the set of stored logic terms and the second set of output signals further comprises a second subset of the set of stored logic terms.

* * * * *